(12) United States Patent
Gurovich et al.

(10) Patent No.: US 7,315,224 B2
(45) Date of Patent: Jan. 1, 2008

(54) HIGH DATA RATE INTERCONNECTING DEVICE

(75) Inventors: Dmitry Gurovich, Holon (IL); Yaakov Haggay, Kfar Saba (IL)

(73) Assignee: RIT Technologies Ltd., Tel-Aviv (IL)

( * ) Notice: Subject to any disclaimer, the term of this patent is extended or adjusted under 35 U.S.C. 154(b) by 663 days.

(21) Appl. No.: 10/785,724

(22) Filed: Feb. 23, 2004

(65) Prior Publication Data

US 2004/0248468 A1 Dec. 9, 2004

Related U.S. Application Data

(63) Continuation of application No. PCT/IL02/00697, filed on Aug. 22, 2002.

(30) Foreign Application Priority Data

Aug. 23, 2001 (IL) ..................................... 145103

(51) Int. Cl.
 *H01P 1/10* (2006.01)
 *H01P 1/04* (2006.01)
 *H01R 24/00* (2006.01)

(52) U.S. Cl. ....................... 333/101; 333/254

(58) Field of Classification Search ................ 333/101, 333/254, 258, 260, 262; 341/172; 342/206; 439/676
See application file for complete search history.

(56) References Cited

U.S. PATENT DOCUMENTS

| 5,161,988 A | 11/1992 | Krupka |
| 5,293,869 A | 3/1994 | Edwards et al. |

| 6,977,607 B2 * | 12/2005 | Leung et al. ................ 341/172 |
| 6,982,706 B1 * | 1/2006 | Doi et al. .................... 345/206 |
| 7,038,554 B2 * | 5/2006 | Seefried .................... 333/24 C |

FOREIGN PATENT DOCUMENTS

EP 0651 465 A2 3/1995

* cited by examiner

*Primary Examiner*—Dean Takaoka
(74) *Attorney, Agent, or Firm*—Pearl Cohen Zedek Latzer, LLP

(57) ABSTRACT

An interconnect apparatus for providing a communication path for data signals in a predetermined frequency band, that includes a first and a second sections of a transmission line, connected at one end to first and second data transceiving devices, respectively. A switch, such as a mechanical, electro-mechanical, electronic, electro-magnetic and electro-optical switch, having conductive/non-conductive states, is provided for connecting/disconnecting between the other ends of the first and the second sections, for providing a data communication path between the data transceiving devices while being in its conductive state a third and a fourth sections of a transmission line, each of which connected at one end to a contact of the switch and at the other end to a first and a second connector, respectively. A compensation circuitry is provided for compensating, within the frequency band, parasitic effects caused by the switch and/or cord, while the switch is in its conductive state or, while the switch is in its non-conductive state and while a connection between the first and the second connectors is provided by a cord having predetermined characteristics, such that the compensation circuitry compensates the influence of parasitic effects introduced along the communication path by the switch while being in its non-conductive state and while the cord is a part of the communication path or, by the combination of the third and a fourth sections and the connectors while the switch is in its conductive state.

20 Claims, 9 Drawing Sheets

HIGH DATA RATE INTERCONNECTING DEVICE

RELATED APPLICATION

This application is a Continuation Application of PCT International Application No. PCT/IL02/00697, filed Aug. 22, 2002, entitled "HIGH DATA RATE INTERCONNECTING DEVICE", which in turn claims priority from Israeli Patent Application No. 145103, filed Aug. 23, 2001, entitled "HIGH DATA RATE INTERCONNECTING DEVICE", both of which are incorporated by reference herein in their entirety.

BACKGROUND OF THE INVENTION

1. Field of the Invention

The present invention relates to the field of interconnecting devices for data communication. More particularly, the invention relates to an interconnecting device being a part of a communication path, for allowing the transmission of high rate data signals over the communication path.

2. Prior Art

The number of devices and systems capable of exchanging high-rate digital data (i.e. wideband signals) is growing rapidly. Such systems are, for example, computers/LAN and WAN networks, telecommunication systems and Internet oriented devices. A major problem exists whenever a high-rate data signal is forwarded through a (physical) channel. The problem with physical channels originally designed for relatively low rate data signals, is that at higher data rates (i.e., at higher frequencies) the data signals become distorted and attenuated due to energy losses and parasitic effects. This problem becomes acute whenever the physical channel includes an interconnecting device for interconnecting between two data devices. This phenomenon is due to impedance mismatches between the devices and cross-talk interference between their corresponding transmission lines, resulting, e.g., in increased reflected energy (i.e. energy losses) and deterioration in the quality of data signals. In case when the communication path comprises differential transmission line, the balance of the differential lines is also deteriorated due to these parasitic effects.

Currently, there are several interconnecting devices being utilized as part of transmission lines, which have been designed to allow data devices to exchange data signals at rates that correspond to a bandwidth up to 100 MHz. Usually, such transmission lines involve interconnecting devices that are based on a cord having an input plug/jack connector on each of its ends (e.g. an RJ45 standard interconnecting device). Such interconnecting devices are associated with compensation means for allowing two high rate data devices (operating within 100 MHz bandwidth) to exchange data signals through the interconnecting devices without substantially deteriorating the quality of the data signal. However, attempts have been made to use switches as interconnecting devices in frequency bandwidth higher than 100 MHz, which resulted in sever deterioration in the data signal passing through such switches within this bandwidth.

It would be desirable to utilize a switch as an interconnecting device for interconnecting high-rate data devices (over 100 MHz), since a switch might be implemented as a micro switch, thereby reducing installation dimensions. Moreover, a switch might be an electronic switch, thereby allowing its operation by a local, or remote, controller.

FIG. 1 (prior art) illustrates a conventional interconnect device contained in an interconnect panel 13, for interconnecting two data systems 11 and 12. As described before, a conventional data path comprises transmission line segments E and A, RJ45 cord 15 and transmission line segments D and F is capable of forwarding data signals at bandwidth up to 100 MHz. Switch 14, on the other hand, has introduced significant parasitic elements that caused impedance mismatches, mutual interference between adjacent transmission lines (i.e. cross talk) and transmission lines were taken out of balance. Consequently, switch 14 has deteriorated the bandwidth to be less than 100 MHz. Wiring blocks 16a and 16b are utilized for affixing electric wires onto a Printed Circuit Board (PCB) so that each wire is electrically connected to its corresponding conductive strip on the PCB. These wiring blocks contain a plurality of Insulation Displacement Contact (IDC), one side of which is used for accepting an individual insulated electrical wire contained in, e.g., transmission lines E and F, and another side of which is soldered to the PCB (such wiring blocks are illustrated, for example, in WWW.SIEMON.COM).

Using a conventional (i.e. relatively low data rate) switch at higher frequencies deteriorates the characteristics of the matched system, since a conventional switch has lumped characteristics only in cases where low rate data signals are involved, otherwise it introduces a rather random impedance characteristic due to its parasitic capacitance(s) and/or inductance(s) at higher frequencies. Consequently, the necessary condition of 'matched lines' will no longer exist whenever conventional switches are used for switching high rate data signals.

All of the methods described above have not yet provided satisfactory solutions to the problem of utilizing a switch, whether as a sole device or in combination with a cord-based interconnecting device, for forwarding high-rate data signals.

SUMMARY OF THE INVENTION

It is an object of the present invention to provide an interconnecting device for transferring high-rate data signals that utilizes a switch, originally designed for relatively low frequency.

It is another object of the present invention to provide an interconnecting device for transferring high-rate data signals that utilizes a switch, originally designed for relatively low frequency, that operates in combination with a patch cord.

It is still another object of the present invention to provide an interconnecting device that allows minimizing impedance mismatches, caused by said low frequency switch.

It is yet another object of the present invention to provide an interconnecting device that allows minimizing cross talk interference caused between a plurality of transmission lines that are positioned in close proximity.

It is further another object of the present invention to provide an interconnecting device that allows balancing of differential transmission lines that are utilized for forwarding high-rate data signals.

Other objects and advantages of the invention will become apparent as the description proceeds.

The present invention is directed to an interconnect apparatus for providing a communication path for data signals in a predetermined frequency band. The apparatus comprises:

a first and a second sections of a transmission line, connected at one end to a first and a second data transceiving devices, respectively;

a switch, such as a mechanical, electro-mechanical, electronic, electro-magnetic and electro-optical switch, having conductive/non-conductive states, for connecting/disconnecting between the other ends of the first and the second sections, for providing a data communication path between the data transceiving devices while being in its conductive state;

a third and a fourth sections of a transmission line, each of which connected at one end to a contact of the switch and at the other end to a first and a second connector, respectively; and a compensation circuitry for compensating, within the frequency band, parasitic effects caused by the switch and/or cord, while the switch being in its conductive state or, while the switch being in its non-conductive state and while a connection between the first and the second connectors is provided by a cord having predetermined characteristics, such that the compensation circuitry compensates the influence of parasitic effects introduced along the communication path by the switch while being in its non-conductive state and while the cord is a part of the communication path or, by the combination of the third and a fourth sections and the connectors while the switch being in its conductive state.

Preferably, the cord is connected between the connectors whenever the switch is in its non-conductive state.

The compensation circuitry may be implemented by Lumped/semi-lumped elements having essentially reactive electrical properties, continuous/non-continuous transmission line segments and Inter Digits. The communication path may include transmission lines which may be implemented with, or without, ground planes, such as Microstripline, coplanar stripline, suspended stripline, paired lines and coaxial lines.

Preferably, compensation is made for impedance mismatch along the path, cross-talk between transmission lines or segments thereof, and imbalance of differential transmission lines. Compensation may be carried out by dividing the transmission line into subsections and by including reactive elements/stubs placed at points along the transmission line. Each of the subsections and/or reactive elements has spatial location and geometric properties, which are predetermined according to the frequency range and/or the type of transmission line.

Compensation may be carried out by generating couplings between transmission lines, the spatial location and geometry of which is determined according to the frequency range and/or the type of transmission line, thereby generating destructive/constructive wave interference that essentially compensates unwanted wave interference. The compensation circuitry may be implemented by utilizing a multi-layered PCB. The data signals may be within a frequency band at least 250 MHz.

Preferably, the length of each section may be shorter than $0.25\lambda$, wherein $\lambda$ is the wavelength at the operating frequency within the frequency band. The length of each stub may be shorter than $0.125\lambda$. The length of each subsection may be shorter than $0.25\lambda$. The distance between coupled transmission lines is shorter than $0.01\lambda$. Conductors of paired lines may be implemented in different layers of the PCB, such that they essentially overlap. The width of the conductor used to implement each section is narrower than $0.01\lambda$. The width of the conductor used to implement each stub may be narrower than $0.01\lambda$. The width of the conductor used to implement each subsection may be narrower than 0.01. The distance between compensating components along a transmission line may be shorter than $0.25\lambda$.

In one aspect, the invention is directed to an interconnecting device which includes a Printed Circuit Board (PCB) that includes transmission lines having compensation elements, which allows interconnecting up to four pairs of high-rate data devices via a communication path that includes a switch that is optionally bypassed by an interconnecting cord, while being in its non-conducting state. According to one aspect of the invention, the interconnecting PCB allows data systems to exchange data signals at significantly higher rates than is allowed when using a switch as interconnecting device in a conventional manner, without jeopardizing the quality of the forwarded data signals. Utilizing the interconnecting PCB disclosed in this invention allows utilizing switches, that alternatively can be bypassed by interconnecting cords, for exchanging data signals at a bandwidth which is sufficient for signals up to 250 MHz.

According to another aspect of the invention, the transmission lines (arranged, for example, in four-pair groups) printed on a PCB are uniquely arranged, so as to significantly minimize three kinds of interference parasitic effects that are introduced by a switch while being in its conducting/non-conducting state: (1) impedance mismatches along the communication path connecting between the high-rate data devices; (2) cross talk between transmission lines; and (3) maintaining each differential transmission line balanced. The terminology 'uniquely arranged' refers, for example, to the spatial positioning and the coplanar geometry of the strip lines, from which the transmission lines are comprised, and refers in particular to the width and length of each subsection that is included in each transmission line, and to the spatial distances between the strip lines. Additionally, a multi-layered PCB is used, for allowing printing strip lines on different layers of the PCB, each layer having its particular thickness and dielectric constant, in order to obtain the required compensation for the above-mentioned parasitic effects.

An interconnecting PCB that has two interconnecting means, such as a switch and a cord, coupled to a transmission line is utilized, for connecting two data devices in two alternative paths. Whenever the two data devices are connected to each other by the switch (i.e. the switch being in its conducting state), the electrical properties of the unused segments that are connected to the ends of the cord, are utilized as a part of the compensating circuitry for compensating parasitic effects introduced by the switch and/or said unused segments, while the cord is not connected, as well as the electrical properties of the switch while being in its conducting state. Whenever the two data devices are connected to each other by the cord (i.e. the switch being in its non-conducting state), the electrical properties of the non-conducting switch are also utilized as a part of the compensating circuitry for compensating parasitic effects introduced by the switch and/or by the connected cord. This way, the parasitic effects that are introduced by either means, are significantly minimized and the interconnecting PCB as a whole remains matched to the transmission line and to the data devices connected to it.

The technique employed by the present invention makes use of transmission line techniques known as Microstrip Line (MSL) structures, Coplanar structures such as Coplanar Striplines (CSL), Paired Strip Lines and Suspended Striplines (SSL), with, or without, a physical ground plane. According to the MSL technique, conductive transmission lines are formed on top of a dielectric substance with a ground plane below the substrate.

According to one aspect of the invention, additional stubs have been placed between adjacent transmission lines, which are utilized for generating coupling between the electromagnetic fields of the adjacent transmission lines. These designed couplings allow compensating the unwanted wave interference (i.e. cross talk) by generating additional constructive/destructive wave interference.

Differential transmission lines can be maintained balanced as they are fabricated while ensuring that a first conductive strip line of each transmission line passes essentially above, and overlaps, the corresponding second conductive strip line of the same transmission line. By overlapping strip lines of same transmission line, an effect similar to the effect of 'twisted-pair' cable is achieved, namely, a considerable immunity to external interference is achieved.

It should be noted that the location, geometry and dimension(s) of each strip line and stub, as well as the coplanar and spatial spacing between strip lines and stubs and the dielectric constant of various portions of the multi-layered PCB, affect each parasitic factor regarding each one of the pairs of transmission lines, i.e., impedance mismatches, cross talk interference and balancing the transmission lines.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS OF THE INVENTION

Figure 1:
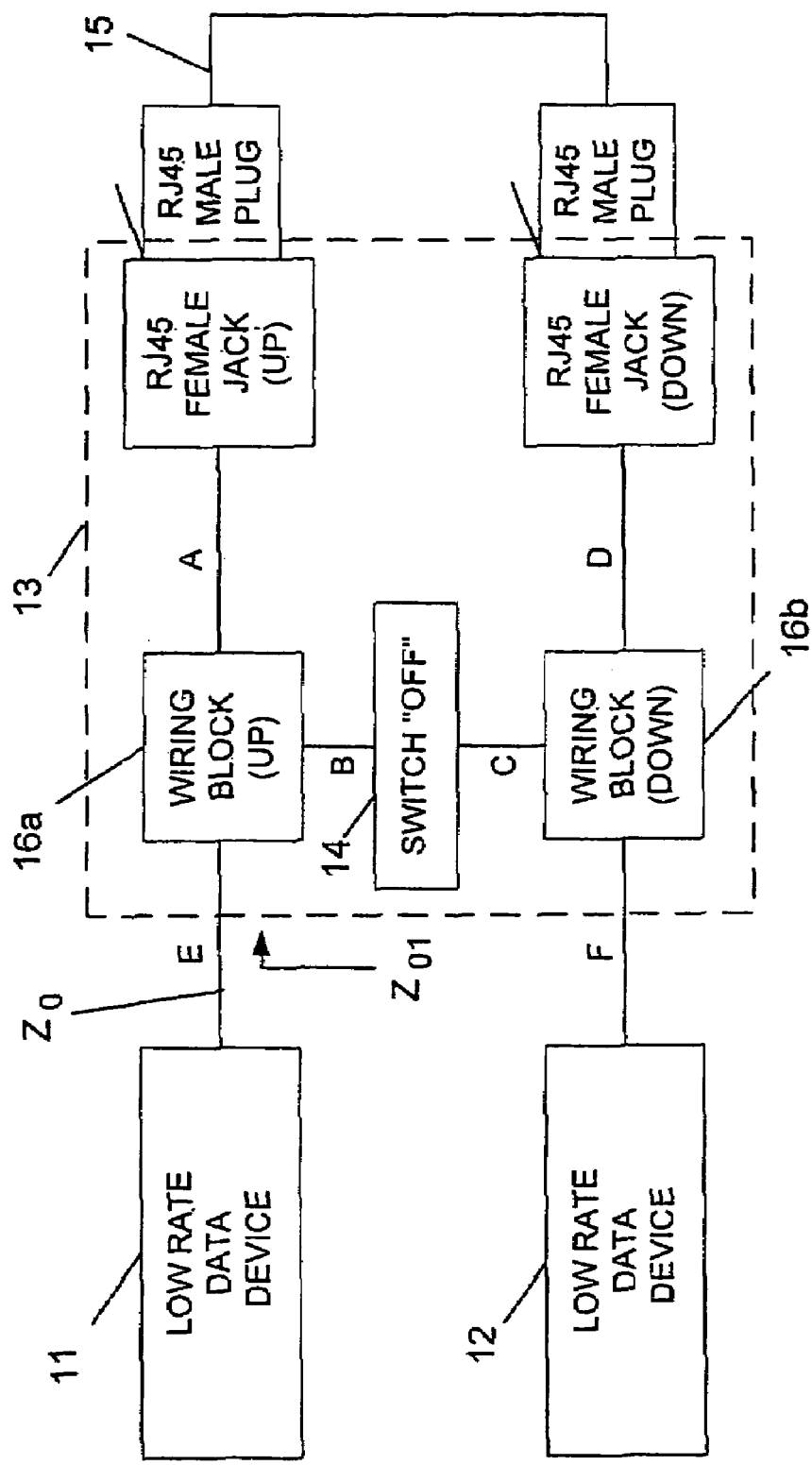
FIG. 1 (prior art) schematically illustrates connecting two low data rates systems by means of a conventional interconnect module.
Figure 2:
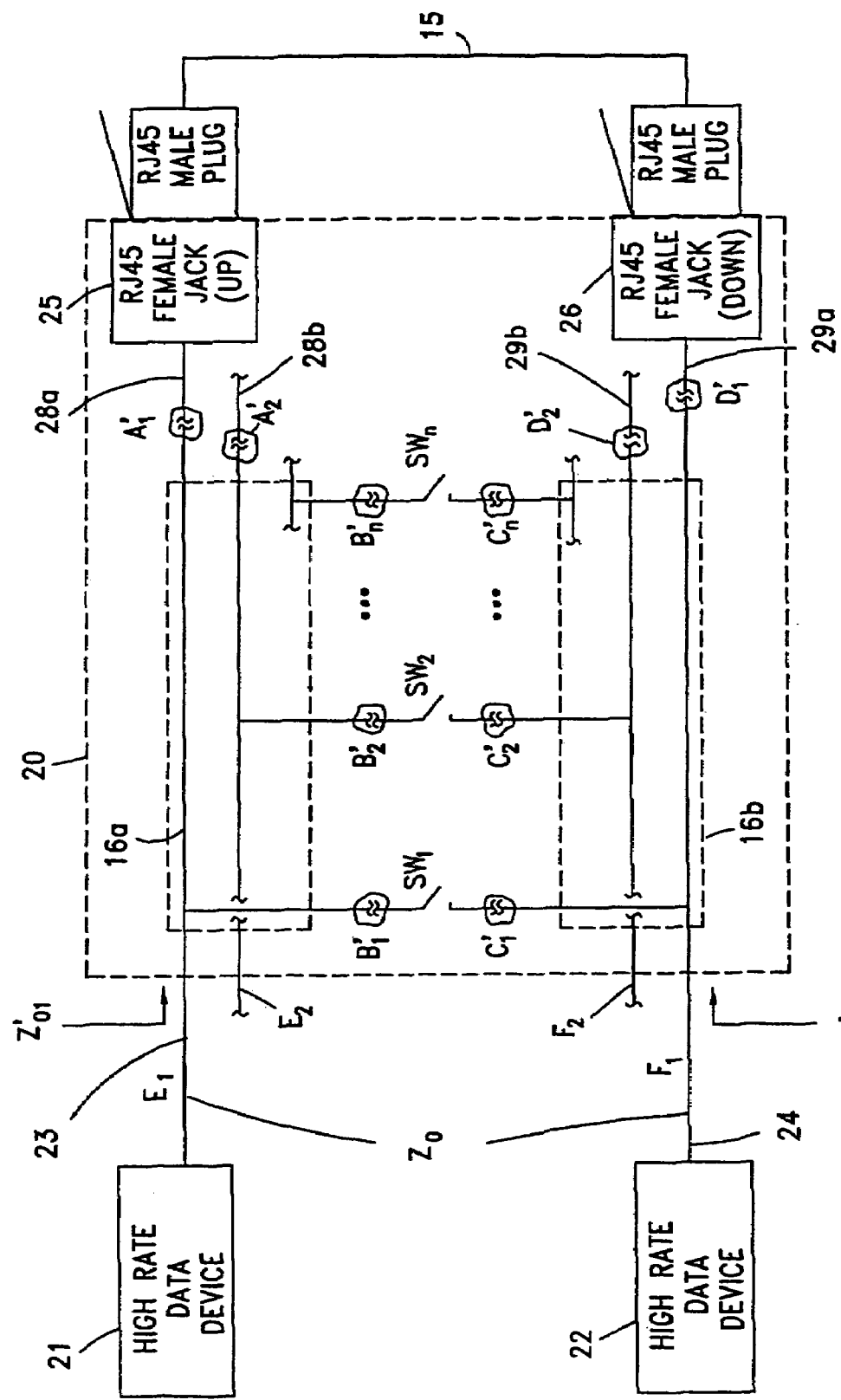
FIG. 2 schematically illustrates two data systems coupled to an interconnect module, according to a preferred embodiment of the present invention.

FIG. 2 illustrates the utilization of the prior art interconnect module illustrated in FIG. 1, for connecting two high-rate data systems 21 and 22. Assuming a high-rate data flow from server 21 to user 22, an optimal case would be having transmission line 23 impedance equal to the impedance of interconnecting module 13, i.e. $Z_O=Z_{O1}$ (FIG. 1), in which case no compensation arrangements $A'_i$, $B'_i$, $C'_i$ and $D'_i$ (FIG. 2) would be required. However, as described before, interconnecting module 13 (FIG. 1) introduces impedance that significantly differs from $Z_O$ (i.e. $Z_{O1} \ll Z_O$) whenever high-rate data signals are involved. This impedance mismatch is frequency dependent and becomes more acute as the frequency of the forwarded data signal becomes higher, due to growing energy reflections caused by 'improper' (i.e., deviating from the characteristic value) impedance introduced by interconnecting module 13 (FIG. 1). Consequently, the signal becomes more distorted and attenuated as it propagates to its destination. Additionally, since panel 13 (FIG. 1) is utilized for interconnecting a plurality of data systems similar to systems 21 and 22 (via, e.g., transmission lines $E_1$, $F_1$ and $E_2$, $F_2$, FIG. 2), a cross talk interference exists between, e.g., lines 28a and 28b and between lines 29a and 29b, which deteriorates the performance of the interconnecting module as a whole.

The solution to the above-mentioned impedance matching problem and cross talk interference is implemented by adding compensation elements for minimizing essentially any impedance mismatch(es) introduced by interconnecting module 13 (FIG. 1) and cross talk interference between adjacent transmission lines contained within module 13 (FIG. 1). A specific solution (i.e. for the required application/bandwidth) should be satisfactory in three aspects: (1) it should allow forwarding bidirectional data signals; (2) it should allow utilizing either switch 14 or patch cord (i.e. jumper) 15 (FIG. 1), without jeopardizing the quality of the forwarded data signal; and (3) it should minimize essentially any cross talk interference between any given two transmission lines. According to the invention, compensation arrangements $A'_i$, $B'_i$, $C'_i$ and $D'_i$ are utilized for fulfilling the three above-mentioned criteria. For example, whenever SW1 and SW2 are in their non-conducting state (and patch cord 15 connected), sections $B'_1$ and $C'_1$ (FIG. 2) are designed so as to allow them being utilized as compensation stubs for a transmission line including wiring blocks 16a and 16b, compensation elements $A'_1$ and $D'_1$, strip lines 28a and 28b and 29a and 29b, RJ45 female jacks 25 and 26 and patch cord 15. Compensation stubs $B'_1$ and $C'_1$ are utilized, together with compensation elements $A'_1$ and $D'_1$, both for matching the impedance of interconnect module 20 to the impedance of transmission lines 23 and 24, i.e., $Z'_{o1} \cong Z_o$, and for minimizing cross talk interference, e.g., between a first transmission line including SW1, or (alternatively) patch cord 15, and a second transmission line including SW2, or (alternatively) a corresponding conductors of patch cord 15.

Whenever SW1 and SW2 are in their conducting state (and patch cord disconnected), sections $A'_1$, and $D'_1$, (FIG. 2) are utilized as compensation stubs for a transmission line including transmission lines 23 and 24, wiring blocks 16a and 16b, compensation elements $B'_1$ and $C'_1$, and SW1. Compensation stubs $A'_1$ and $D'_1$ are utilized now, together with compensation elements B'$_1$ and C'$_1$, both for matching the impedance of interconnect module 20 to the impedance of transmission lines 23 and 24, i.e., Z'$_{o1}$≅Z$_o$, and for minimizing cross talk interference, e.g., between a first transmission line including SW1, or (alternatively) patch cord 15, and a second transmission line including SW2, or (alternatively) a corresponding conductors of patch cord 15.

According to the invention, cross talk interference, e.g., between the two transmission lines mentioned in the above-mentioned example, are minimized by designing the geometry of the conductive elements in sections B'$_1$ and B'$_2$ which usually involves creating a combination of capacitive and inductive couplings, for creating constructive and/or destructive wave interference in order to compensate unwanted wave interference. Additionally, or alternatively, other portions of the two transmission lines might be coupled to each other to affect the resulting constructive/destructive wave interference. For example, additional coupling between the transmission lines might be implemented by coupling section C'$_1$ to C'$_2$.

Figures 3A, 3B:
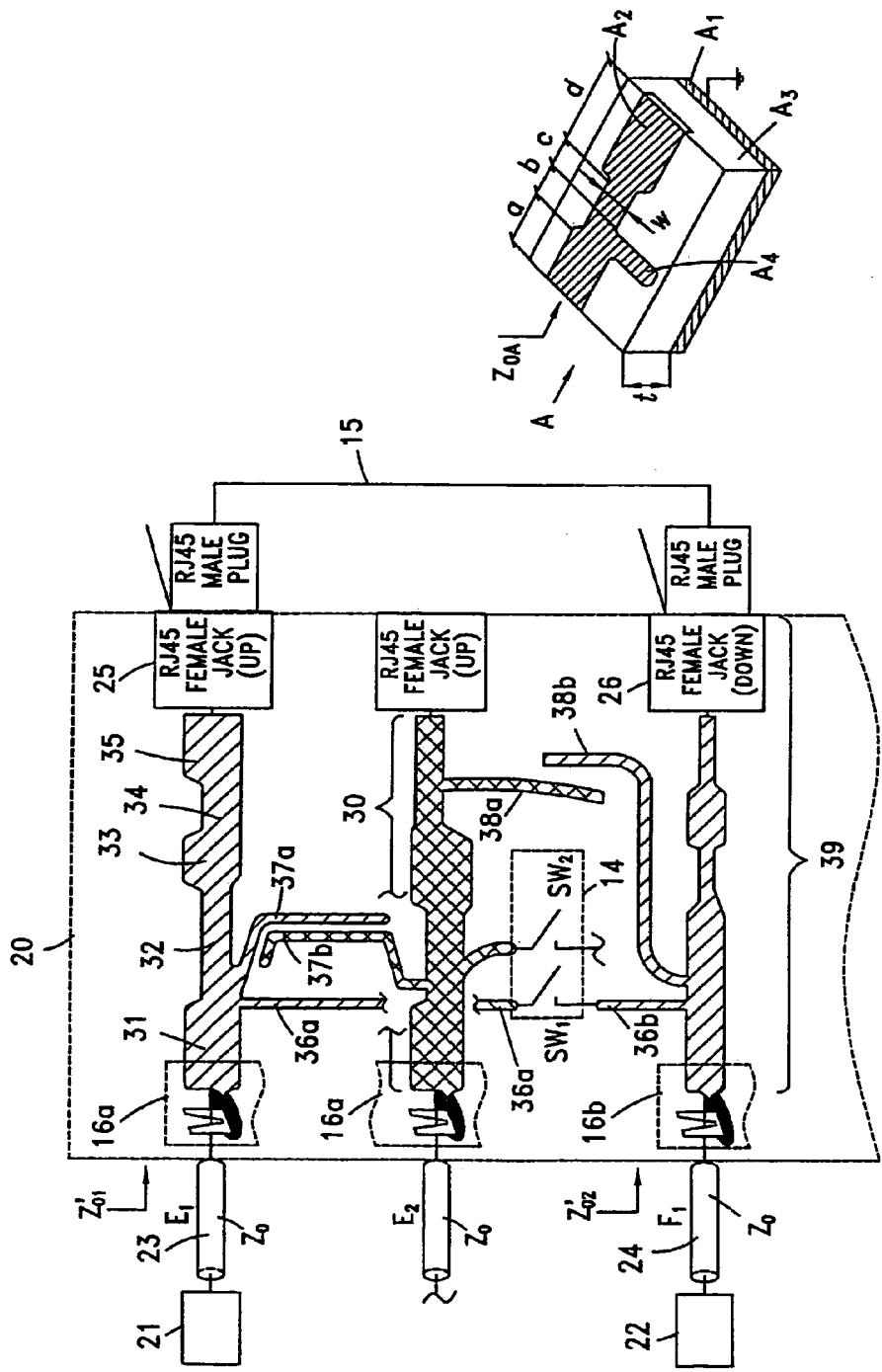
FIG. 3A illustrates an exemplary design of a Printed Circuit Board (PCB), according to a preferred embodiment of the present invention.
FIG. 3B (prior art) illustrates the principle that is utilized for designing the PCB illustrated in FIG. 3A.

FIG. 3A illustrates an exemplary design of a Printed Circuit Board (PCB). Two high-rate data systems 21 and 22 are connected by transmission lines 23 and 24, respectively, to interconnecting module 20 via corresponding contacts contained in wiring blocks 16a and 16b. This figure depicts various subsections, e.g., subsection 31 to 35. Each of these subsections is designed to have (different) required characteristic impedance. However, the accumulative effect of these characteristic impedances is reflected by the fact that eventually Z'$_{O1}$≅Z$_O$ and Z'$_{O2}$≅Z$_O$, no matter whether a switch (e.g. SW1) or a patch cord (e.g. patch cord 15) is utilized for connecting between two data systems (e.g. data systems 21 and 22). For example, whenever data signals are exchanged between, e.g., data systems 21 and 22 via SW1 (i.e. SW1 is in its conducting state), subsections 32 to 35, together with RJ45 female jack 25, form a first compensation 'stub'. Additionally, section 39 forms a second compensation 'stub'. These first and second compensation stubs are utilized for compensating for impedance mismatches caused by SW1. On the other hand, whenever data signals are exchanged between, e.g., data systems 21 and 22 via patch cord 15, subsections 36a and 36b, together with the open (i.e. non-conducting) SW1, form a compensation 'stub', for compensating for impedance mismatches caused by patch cord 15.

Still referring to FIG. 3A, in order to minimize the cross talk between adjacent transmission lines, dedicated strip lines (i.e. stubs) have been added to the PCB. For example, the geometry of strip lines 37a and 37b has been meticulously designed to create a wave interference, between the transmission line interconnecting data systems 21 and 22 and a transmission line one part of which is section 30, that will counteract the existing (i.e. original) wave interference, resulting in minimized cross talk. Additionally, or alternatively, strip lines might be utilized for minimizing the cross talk interference, for example, strip lines 38a and 38b. Determining the geometry of the subsections (e.g. subsections 32 to 35) is carried out in accordance with a technique known as the Microstrip Transmission Line (MTL), according to which the geometry of each subsection is determined according to the desired characteristic impedance.

FIG. 3B illustrates an exemplary portion of a PCB, in which desirable characteristic impedance is achieved by a strip line in accordance with the MTL technique. A conductive circuit A2 is printed on top of a dielectric substrate A3 having a (relative) dielectric constant ∈$_r$. Currently, there are several substrates, having different dielectric constants ∈$_r$, from which a preferred substrate (i.e. ∈$_r$) may be chosen in order to acquire the desirable impedance. Below substrate A3 is printed a ground plane A1. However, utilizing A1 as a ground plane is only an option, since it might be utilized, in conjunction with A2, as a differential transmission line, in accordance with a technique known as "Paired Strips". The overall impedance Z$_{OA}$, as seen from direction 'A', is weighed impedance of subsections' impedance along conductive circuit A2, i.e. the impedance of subsections a to d, which is primarily a function of three factors: Z$_O$=f{t, w, ∈$_r$}.

FIGS. 4A to 4D illustrate a four-layered (i.e. 40/A to 40/D) PCB circuit implementation of the solution that complies with the compensation technique described hereinabove. The transmission lines in this PCB are implemented by utilizing two techniques, paired strips and coplanar strips. In sections A and D (FIG. 1), transmission lines 1-2, 3-6, 4-5 and 7-8 (the numbering complies with RJ45 standard, IEC-60603-7), which are implemented by the Paired Stripes technique, connect the RJ45 female connector (FIG. 1) to a Wiring Block, such as the one described before, in the shortest spatial route. According to the Paired Stripes technique, a (portion) of a transmission line is comprised of two strip lines kept apart from each other by a non-conductive substrate layer. The transmission lines 4-5 are spaced from other transmission lines at least by 0.5 cm in order to decrease the cross talk interference. The conductors of each pair are fabricated each on different layer of the PCB, wherein they are essentially overlap and the dielectric substrate of the PCB layer is 1.6 mm thick and having ∈$_r$ of 4.6. The transmission lines/stripes have, in different portions/sections, a width of 10 mili-inch and 12 mili-inch (i.e. narrower than 0.01λ), and separates them from one another in order to sustain (the required) impedance of 100[Ω].

The example described hereinabove may be effectively implemented up to 250 MHz using the following physical dimensions (for each section):
 line width: 4 to 20 mili-inch (i.e. narrower than 0.01λ)
 transmission line length: 0 to 3 cm (i.e. shorter than 0.25λ)
 substrate thickness: 1.2 to 1.9 mm
 substrate dielectric constant: 4.2 to 4.8

In sections B and C (FIG. 1), transmission lines 1-2, 3-6 and 4-5, which are implemented by the Paired Stripes technique, connect the wiring block 16a and 16b (FIG. 1) to the corresponding switch in the shortest spatial route. Transmission lines 7-8, which are implemented by the Paired Stripes technique, connect the RJ45 connectors (FIG. 1) to the corresponding switch in the shortest spatial route. The transmission lines are spaced from each other at least 0.5 cm in order to decrease the cross talk interference. The transmission lines/stripes have, in different portions, a width of 8 mili-inch and 10 mili-inch (i.e. narrower than 0.01λ), and a dielectric substrate, of which thickness is 0.72 mm and ∈=4.6, separates them from one another in order to sustain impedance of 100[Ω].

The example described hereinabove may be effectively implemented up to 250 MHz using the following physical dimensions (for each section):
 line width: 4 to 20 mili-inch (i.e. narrower than 0.01λ)
 transmission line length: 0 to 3 cm (i.e. shorter than 0.25λ)
 substrate thickness: 0.6 to 0.9 mm
 substrate dielectric constant: 4.2 to 4.8

In sections A and D (FIG. 1), transmission lines 1-2, 3-6, 4-5 and 7-8, which are implemented by the Paired Stripes technique, connect the RJ45 connector (FIG. 1) to the corresponding wiring block in the shortest spatial route. The transmission lines are spaced from each other at least 0.5 cm in order to decrease the cross talk interference. The transmission lines/stripes have, in different portions, a width of 10 mili-inch and 12 mili-inch (i.e. narrower than $0.01\lambda$), and a dielectric substrate, of which thickness is 1.6 mm and $\in$=4.6, separates them from one another in order to sustain impedance of 100[Ω]. The latter example can be effectively implemented up to 250 MHz using the following physical dimensions (for each section):

line width: 4 to 20 mili-inch (i.e. narrower than $0.01\lambda$)

transmission line length: 0 to 3 cm (i.e. shorter than $0.25\lambda$)

substrate thickness: 1.2 to 1.9 mm substrate dielectric constant: 4.2 to 4.8

The internal construction of the switch is considered for determining the arrangement of the transmission lines that are connected to the switch, in order to reduce cross talk interference. The internal construction of the switch is also utilized, while not being a part of the communication path, i.e., whenever the switch is in its non-conductive state, as an equivalent array of 'compensation stub' whenever a cord connects between the RJ45 connectors.

The cross talk compensation, impedance matching and balancing mechanism for each transmission line is carried out by implementing an 'inductive-capacitive' coupling between the transmission lines in specific areas on the PCB, as shown in FIGS. 4A to 4D. Coupling is obtained by implementing stubs as Coplanar Strips, which are transmission lines printed on the same layer of the PCB. The stubs are 8 mili-inch wide (i.e. narrower than $0.01\lambda$) conductive stripes, shorter than 5 cm (i.e. shorter than $0.125\lambda$) and 8 mili-inch spaced from each other (i.e. at a distance less than $0.01\lambda$). In addition, coupling stubs have length that are shorter than $0.125\lambda$. However, the coupling may be implemented by utilizing, e.g., Surface Mounting Technology (SMT) capacitors, plate capacitors, Inter Digits (Inter Digits technology is disclosed, for example, in U.S. Pat. No. 5,295,869).

Figure 4A:
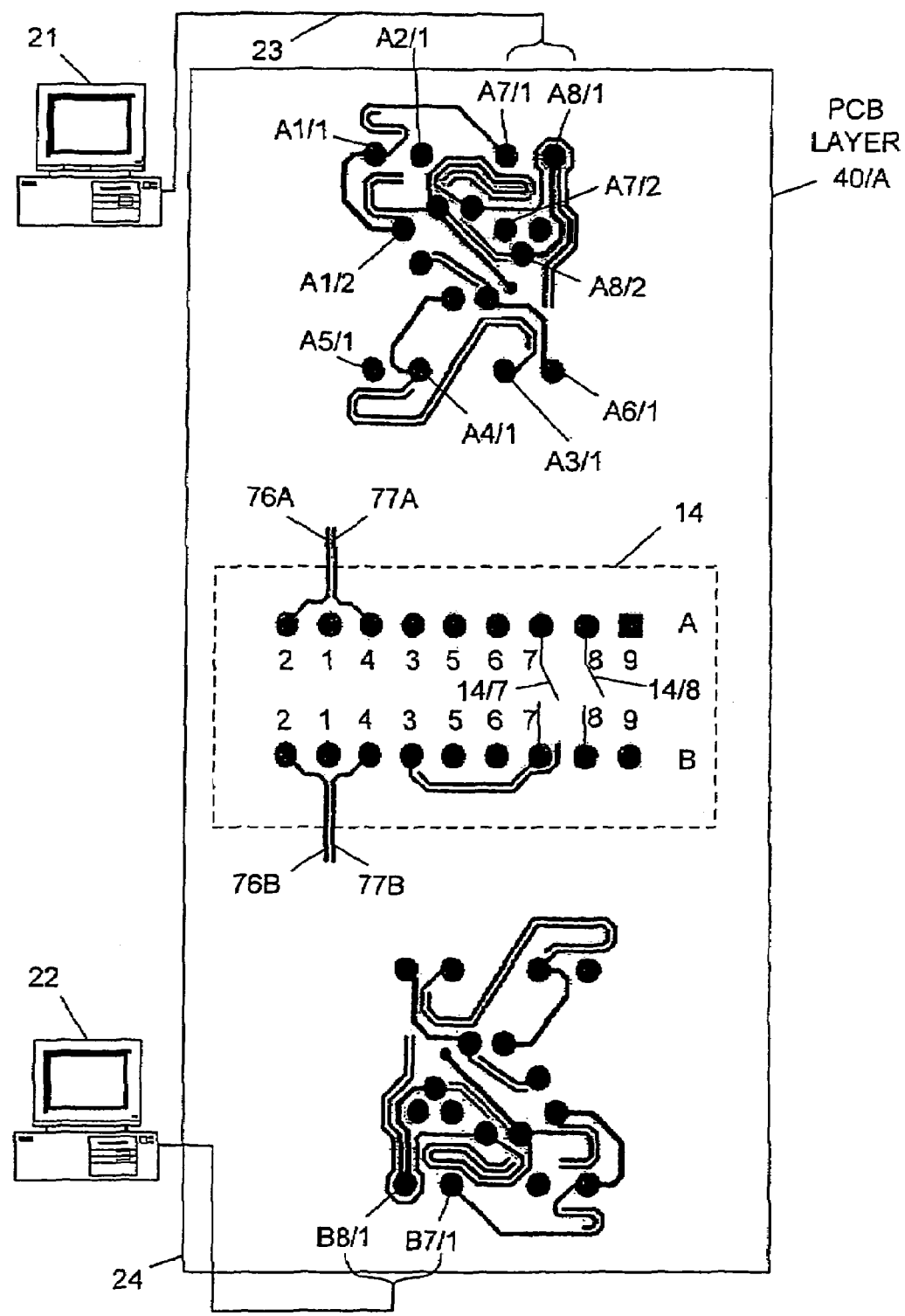
FIG. 4A illustrates a first layer of a Printed Circuit Board (PCB) implementation for impedance mismatches compensation and for significantly reducing the influence of cross talk interference between transmission lines, according to a preferred embodiment of the present invention.
Figure 4B:
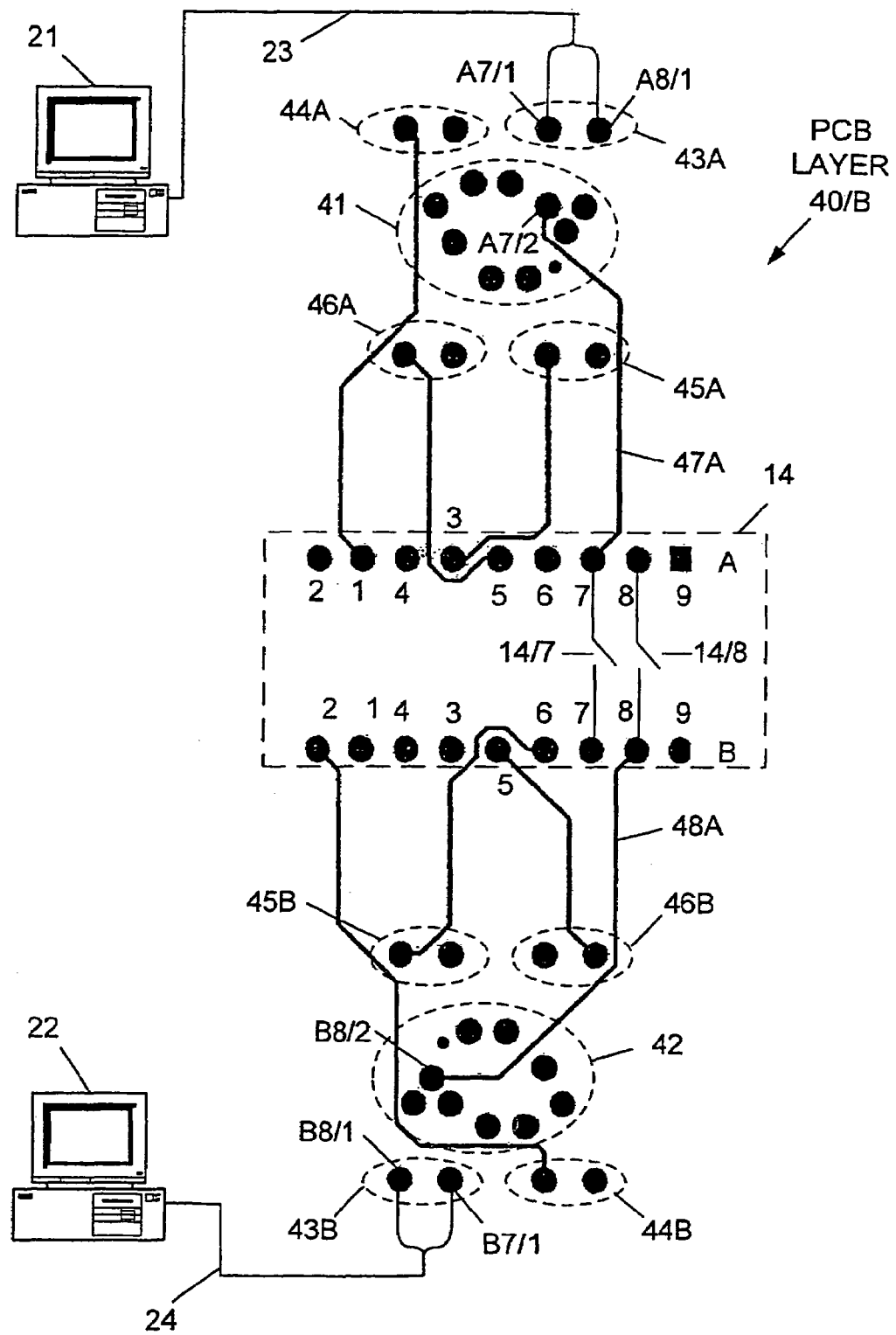
FIG. 4B illustrates a second layer of a Printed Circuit Board (PCB) implementation for impedance mismatches compensation and for significantly reducing the influence of cross talk interference between transmission lines, according to a preferred embodiment of the present invention.

FIG. 4B depicts an exemplary first data system 21 being connected to contacts 43A, and data system 22 being connected to contacts 43B. A connection may be established between data systems 21 and 22 by either utilizing switches 14/7 and 14/8 or corresponding wires in the cord that connects between the RJ45 connectors, of which (in this example) female side is soldered to contacts sets 41 and 42. Similarly, additional three pairs of data systems might be connected to PCB 40, by connecting one from each pair of data systems to contacts 44A, 45A and 46A, respectively, and their corresponding data systems to contacts 44B, 45B and 46B, respectively. For example, a data system connected to 44A is allowed to exchange data with a corresponding data system connected to 44B etc.

Figure 4C:
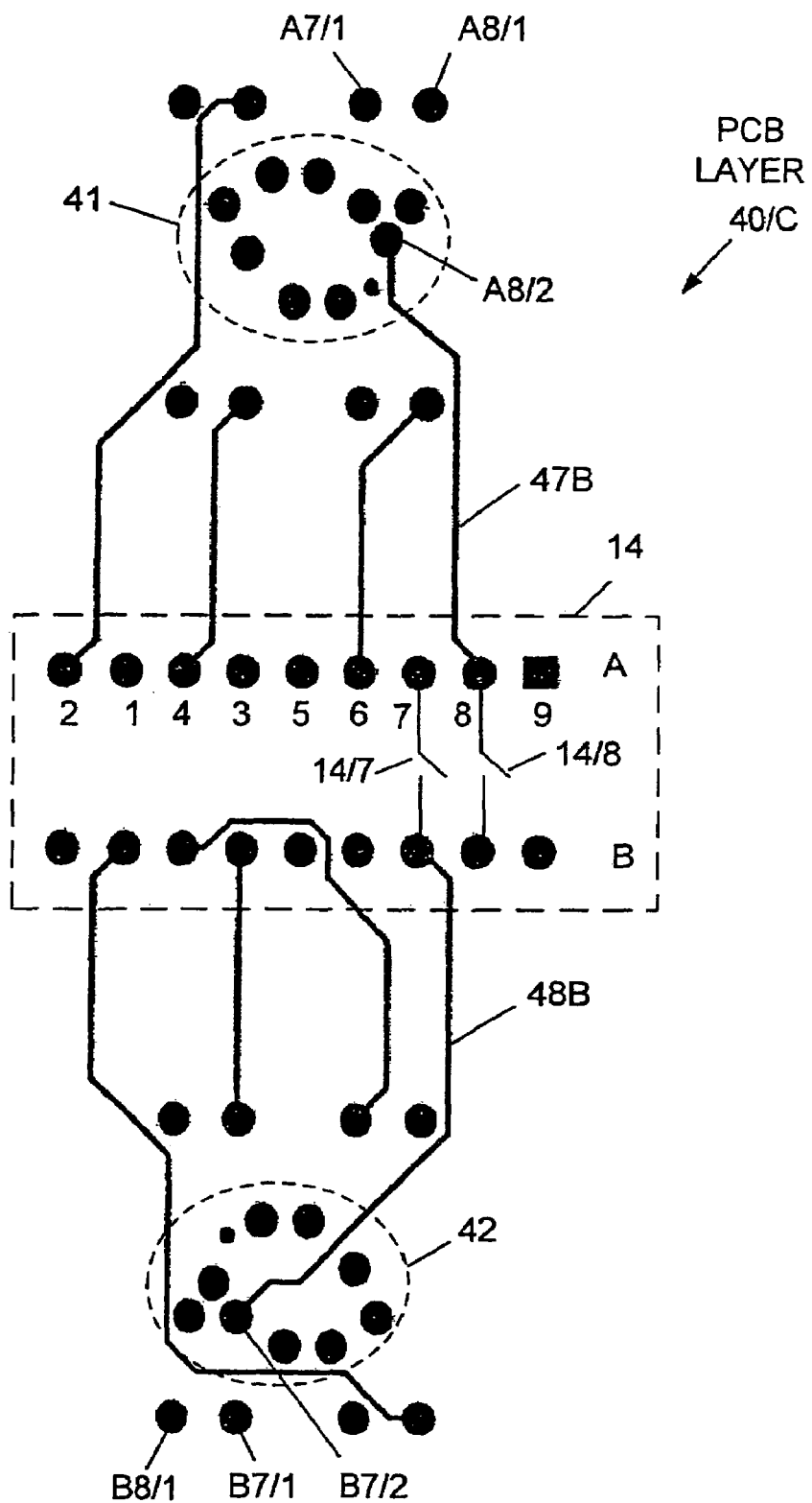
FIG. 4C illustrates a third layer of a Printed Circuit Board (PCB) implementation for impedance mismatches compensation and for significantly reducing the influence of cross talk interference between transmission lines, according to a preferred embodiment of the present invention.
Figure 4D:
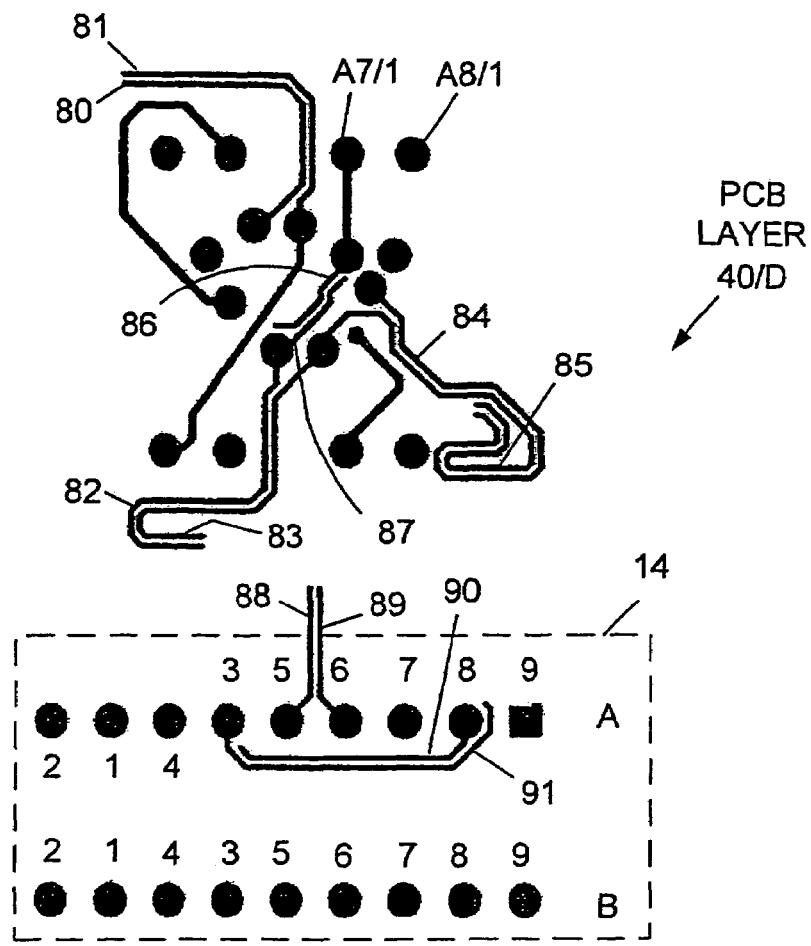
FIG. 4D illustrates a forth layer of a Printed Circuit Board (PCB) implementation for impedance mismatches compensation and for significantly reducing the influence of cross talk interference between transmission lines, according to a preferred embodiment of the present invention.
Figure 4D:
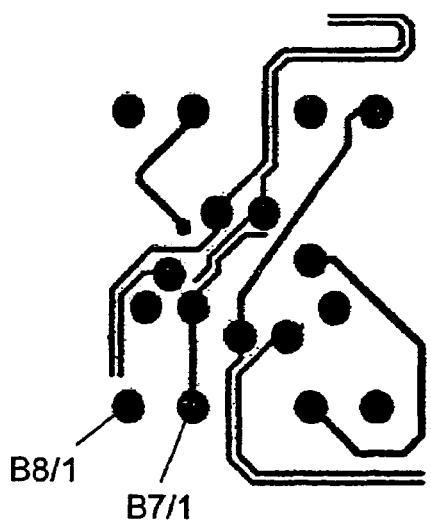
Figure 5:
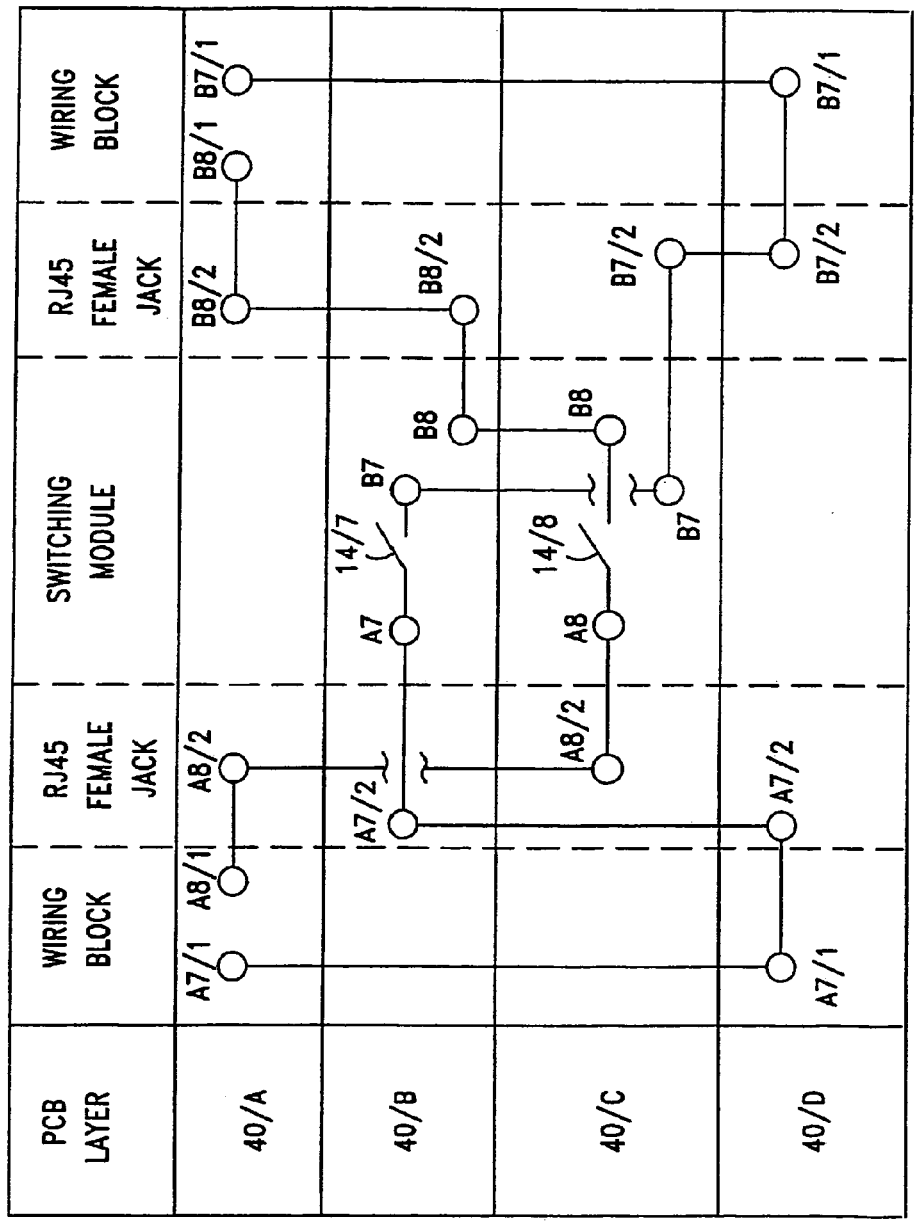
FIG. 5 is an exemplary route of one of the transmission lines illustrated in FIGS. 4A to 4D.

A description of typical complete route, between two data systems, such as data systems 21 and 22, is the following: data system 21 is connected to terminals A7/1 and A8/1 and data system 22 to terminals B7/1 and B8/1 Terminal A8/1 is connected by a conductive strip line to contact A8/2 on layer 40/A (FIG. 4A), which is further connected (through a different layer) to a corresponding conductive contact A8/2 on layer 40/C (FIG. 4C). Contact A8/2 (i.e. in layer 40/C) is connected by a conductive strip line 47B to conductive contact 8 in row A in switching block 14, which is connected, whenever switch 14/8 is in its conducting state, to contact 8 in row B, which is common to all layers of the PCB, and is connected to the corresponding terminal B8/2 on layer 40/B (FIG. 4B), which is connected to terminal B8/2 on layer 40/A through strip line 48A. B8/2, which is also common to all layers, is further connected to B8/1, thereby completing the route from terminal A8/1 to B8/1 in layer 40/A (FIG. 4A). A route, connecting terminals A7/1 and B7/1 (FIG. 4A), is established in a similar manner. Consequently, data systems 21 and 22 are allowed to exchange data only if switches 14/7 and 14/8 are simultaneously in their conducting state, or, alternatively, if corresponding wires of a cord connecting between RJ45 connectors (jumper 15 in FIGS. 1 and 5), are connected between terminals 41 and 42 (FIG. 4B). The above-described route is depicted in FIG. 5.

It is well known in the art of transmission line implementation techniques that in order to obtain capacitive reactances, the adjustments/compensations may be implemented on portions of a transmission line ("stubs" or "subsection") having a length which is shorter than quarter wavelength $\lambda/4$ at the operating frequency (i.e. within the desirable frequency band) of the forwarded data signal. These capacitive reactances are used to adjust the impedance and to compensate for obtaining improved balance and for reducing cross talk effects. Stubs may also be added to a transmission line, so as to allow additional flexibility in manipulating the resulting overall impedance of the transmission line.

Referring again to FIGS. 4A to 4D, every conductive subsection printed on each layer of PCB 40 has a length l<5 cm (i.e. shorter than $0.25\lambda$) for bandwidths up to 250 MHz. Since the specific/required bandwidth, for which the solution disclosed in the invention is directed to, is about 250 MHz, the shortest quarter wavelength $\lambda/4$ is about 14 cm. Therefore, the above-mentioned condition (i.e. $l<\frac{1}{4}\lambda$) for allowing adjustments/compensations is met.

As described above, each transmission line is maintained balanced by utilizing differential transmission lines and by ensuring that a first conductive strip line of a transmission line passes essentially above, and overlaps, the second conductive strip line of the same transmission line. Referring to FIGS. 4B and 4C, balancing, e.g., transmission line 7-8 is carried out by allowing sections 47A and 48A (FIG. 4B) of transmission line 7-8 to overlap the corresponding sections 47B and 48B (FIG. 4C) of the same transmission line.

FIG. 5 illustrates in a simpler way the routes from terminals A7/A8 to terminals B7/B8 that are described above. The transmission line (i.e. A7/1 and A8/1 to/from B7/1 and B8/1) comprises several subsections, each of which having essentially a different characteristic impedance caused by having a strip line with different width. In FIG. 5, subsections A8/1→A8/2 (layer 40/A) and B8/2→B8/1 (layer 40/A) consist of 12 mili-Inch strip lines (i.e. narrower than $0.01\lambda$). Subsections A8/2→contact 8 in row A of switching module 14 (layer C) and contact 8 in row B of switching module 14→B8/2 (layer B) consist of 8 mili-Inch strip lines (i.e. narrower than $0.01\lambda$). Similarly, the route from terminal A7/1 to B7/1 consist of 12 and 8 mili-Inch (i.e. narrower than $0.01\lambda$) width subsections.

Figure 6:
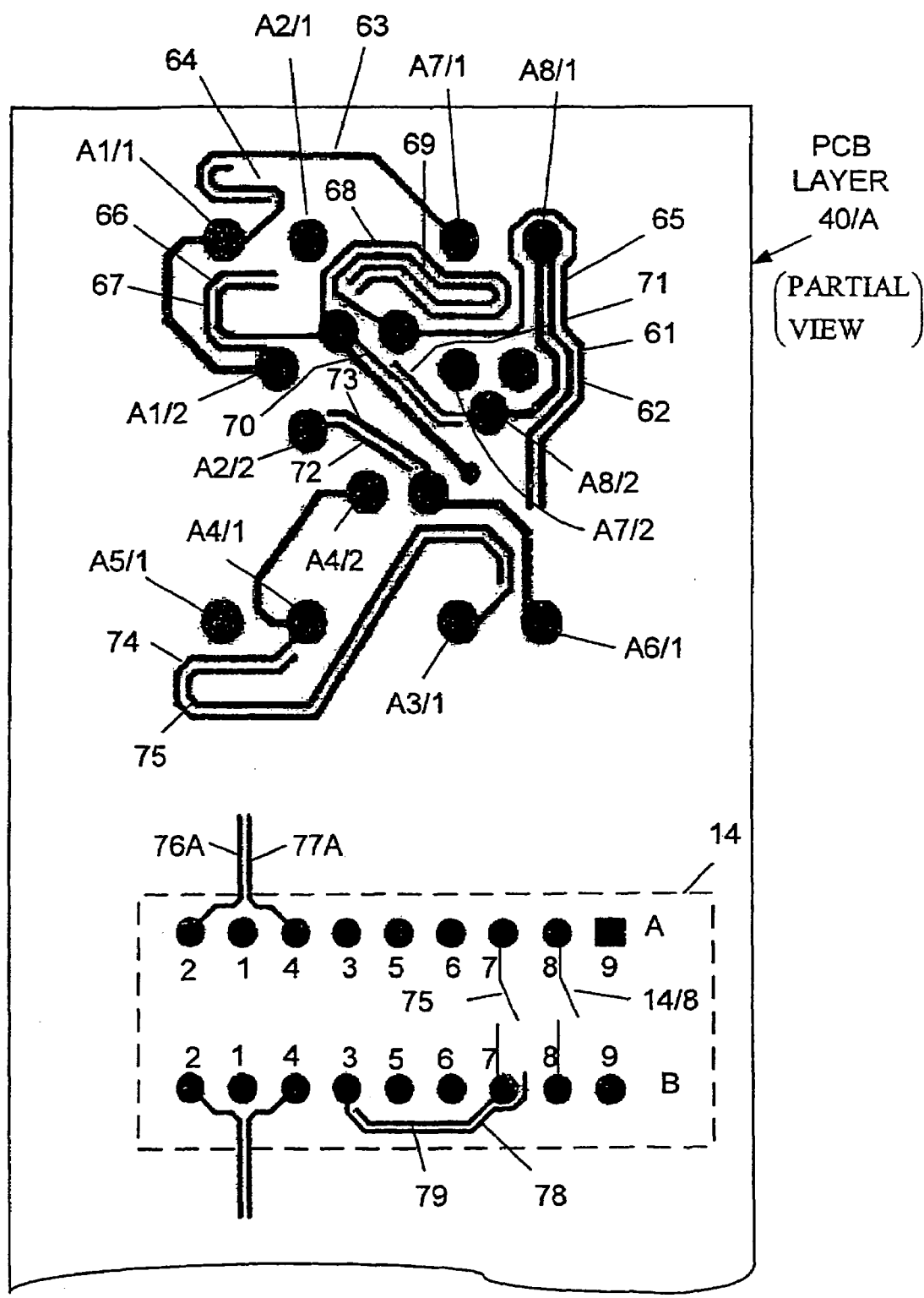
FIG. 6 illustrates a partial view of a layer, in which stubs having various shapes and orientations are utilized for effectively decreasing the influence of the parasitic effects, according to a preferred embodiment of the present invention.

FIG. 6 illustrates a partial view of layer A, in which stubs having various shapes and orientations are utilized for effectively decreasing the effect of cross talk and imbalance between transmission lines, as well as impedance mismatches. For example, in order to effectively decrease the cross talk interference between transmission lines <A1/1, A2/1> and <A7/1,A8/1>, stubs 63 and 64 create a corresponding coupling that decrease the mutual interference (i.e. cross talk). The location of stubs 63 and 64 along the transmission line is determined according to the level of cross talk to be compensated and in this example, are located at the beginning of the transmission lines. Whenever switches 14/7 and 14/8 are in their conductive state, strip line 65 is utilized as 'compensation stub'.

In this example, stubs 68, 69, 80 and 81 (which are located along the conductors that are connected to contacts <3,5> of the RJ45 connector) are 8 mili-inch wide (i.e. narrower than 0.01λ) and may be 0 to 5 cm long (i.e. shorter than 0.125λ), spaced 8 mili-inch apart from each other (i.e. a distance less than 0.01λ) and located as close as possible to the contacts of the RJ45 connectors. Stubs 82 and 83 (in FIG. 4D), which are located along the conductors that are connected to contacts <4,6> of the RJ45 connector, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connectors. Stubs 74 and 75 (in FIG. 6), which are located along the conductors that are connected to contacts <3,4> of the wiring block, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connectors. Stubs 70 and 71 (in FIG. 6), which are located along the conductors that are connected to contacts <3,8> of the RJ45 connector, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connectors. Stubs 84 and 85 (in FIG. 4D), which are located along the conductors that are connected to contacts <6,8> of the RJ45 connector, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connectors. Stubs 78 and 79 (in FIG. 6), which are located along the conductors that are connected to contacts <3,7> of row B in the switching module, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the switch. Stubs 90 and 91 (in FIG. 4D), which are located along the conductors that are connected to contacts <3,8> of row A in the switching module, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the switch. Stubs 88 and 89 (in FIG. 4D), which are located along the conductors that are connected to contacts <5,6> of row A in the switching module, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the switch. Stubs 61 and 62 (in FIG. 6), which are located along the conductors that are connected to contacts <5,8> in the RJ45 connector, are 8 mili-inch wide (i.e. narrower than 0.01λ) and may be 0 to 5 cm long wide (i.e. shorter than 0.25λ), spaced 8 mili-inch apart from each other (i.e. at distance less than 0.01λ) and located as close as possible to the contacts of the RJ45 connector. Stubs 86 and 87 (in FIG. 4D), which are located along the conductors that are connected to contacts <4,7> in the RJ45 connector, are 8 mili-inch wide (i.e. narrower than 0.01λ) and may be 0 to 5 cm long wide (i.e. shorter than 0.25λ), spaced 8 mili-inch apart from each other (i.e. at distance less than 0.01λ) and located as close as possible to the contacts of the RJ45 connector. Stubs 66 and 67 (in FIG. 6), which are located along the conductors that are connected to contacts <1,3> in the RJ45 connector, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connector. Stubs 72 and 73 (in FIG. 6), which are located along the conductors that are connected to contacts <2,6> in the RJ45 connector, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the RJ45 connector. Stubs 76a, 76b, 77a and 77b (in FIG. 6), which are located along the conductors that are connected to contacts <2,4> of rows A and B, respectively, of the switching module, are 8 mili-inch wide (i.e. narrower than 0.01λ) and may be 0 to 5 cm long (i.e. shorter than 0.25λ), spaced 8 mili-inch apart from each other (i.e. at distance less than 0.01λ) and located as close as possible to the contacts of the switching module.

Referring now to the aspect of impedance compensation, typical transmission line impedance is, e.g., 100[Ω]. A conventional interconnecting module, such as is described above, may have, for example, complex impedance Z=32+j15[Ω] (i.e. at a frequency of 250 MHz). If the interconnecting module is connected directly to the transmission line, the significant impedance mismatch may result in sever attenuation and distortion of the high-rate data signal passing through the interconnect module. However, after utilizing the compensation stubs, the characteristic impedance of which is designed in accordance with the present invention, significantly improved impedance may be obtained, for example Z=(95÷105)+j(2÷5)[Ω].

The above examples and description have of course been provided only for the purpose of illustration, and are not intended to limit the invention in any way. As will be appreciated by the skilled person, the invention can be carried out in a great variety of ways, employing more than one technique from those described above, such as compensating parasitic effects in frequencies higher than 250 MHz, all without exceeding the scope of the invention.

What is claimed is:

1. Interconnect apparatus for providing a communication path for data signals in a predetermined frequency band, comprising:
   first and second sections of a transmission line, connected at one end to first and second data transceiving devices, respectively;
   a switch, having conductive/non-conductive states, for connecting/disconnecting between the other ends of said first and said second sections, for providing a data communication path between said data transceiving devices while being in its conductive state;
   third and fourth sections of a transmission line, respectively connected at one end to first and second contacts of said switch and at the other end to first and second connectors, said first and second connectors connectable via a cord; and
   a compensation circuitry to compensate, within said frequency band, for parasitic effects caused by said switch and/or cord while said switch being in its conductive or non-conductive state, such that said compensation circuitry compensates for the influence of parasitic effects introduced along said communication path by said switch while being in its non-conductive state and said compensation circuitry compensates for the influence of parasitic effects introduced along said communication path by said third and fourth sections and said connectors while said switch being in its conductive state.

2. Interconnect apparatus according to claim 1, in which the cord is connected between the connectors when the switch is in its non-conductive state.

3. Interconnect apparatus according to claim 1, in which the compensation circuitry is implemented by utilizing components selected from the following group:
 lumped/semi-lumped elements having essentially reactive electrical properties;
 continuous/non-continuous transmission line segments; and
 inter Digits.

4. Interconnect apparatus according to claim 1, in which the communication path includes transmission lines selected from the following group:
 microstripline;
 coplanar stripline;
 suspended stripline;
 paired lines; and
 coaxial lines.

5. Interconnect apparatus according to claim 4, in which the transmission lines are implemented with, or without, ground planes.

6. Interconnect apparatus according to claim 1, in which the compensation circuitry compensates for the effect of the following parasitic effects:
 impedance mismatch along the path;
 cross-talk between transmission lines or segments thereof;
 imbalance of differential transmission lines.

7. Interconnect apparatus according to claim 1, in which compensation is carried out by dividing the transmission line into subsections and by including reactive elements/stubs placed at points along said transmission line, each of said subsections and/or reactive elements having spatial location and geometric properties which are predetermined according to the frequency range and/or the type of transmission line.

8. Interconnect apparatus according to claim 1, in which compensation is carried out by generating couplings between transmission lines, the spatial location and geometry of which is determined according to the frequency range and/or the type of transmission line, thereby generating destructive/constructive wave interference that essentially compensates unwanted wave interference.

9. Interconnect apparatus according to claim 1, in which the switch is selected from the following group of switches:
 a mechanical switch;
 an electromechanical switch;
 an electronic switch;
 an electro-magnetic switch;
 electro-optical switch.

10. Interconnect apparatus according to claim 1, in which the compensation circuitry is implemented by utilizing a multi-layered PCB.

11. Interconnect apparatus according to claim 1, in which the data signals have maximum frequencies being equal to or higher than 250 MHz.

12. Interconnect apparatus according to claim 1, in which the length of each section is shorter than $0.25\lambda$, wherein $\lambda$ is the wavelength at the operating frequency within the frequency band.

13. Interconnect apparatus according to claim 7, in which the length of each stub is shorter than $0.125\lambda$, wherein $\lambda$ is the wavelength at the operating frequency within the frequency band.

14. Interconnect apparatus according to claim 7, in which the length of each subsection is shorter than $0.25\lambda$, wherein $\lambda$ is the wavelength at the operating frequency within the frequency band.

15. Interconnect apparatus according to claim 8, in which the distance between coupled transmission lines is shorter than $0.01\lambda$, wherein $\lambda$ is the wavelength at the operating frequency within the frequency band.

16. Interconnect apparatus according to claim 10, in which conductors of paired lines are implemented in different layers of the PCB, such that they essentially overlap.

17. Interconnect apparatus according to claim 1, in which the width of the conductor used to implement each section is narrower than $0.01\lambda$, wherein $\lambda$ is the wavelength at the operating frequency within the frequency band.

18. Interconnect apparatus according to claim 5, in which the width of the conductor used to implement each stub is narrower than $0.01\lambda$, wherein $\lambda$ is the wavelength at the operating frequency within the frequency band.

19. Interconnect apparatus according to claim 5, in which the width of the conductor used to implement each subsection is narrower than $0.01\lambda$, wherein $\lambda$ is the wavelength at the operating frequency within the frequency band.

20. Interconnect apparatus according to claim 3, in which the distance between compensating components along a transmission line is shorter than $0.25\lambda$, wherein $\lambda$ is the wavelength at the operating frequency within the frequency band.

* * * * *